United States Patent [19]

Wilkens

[11] 4,429,324

[45] Jan. 31, 1984

[54] ZENER DIODE AND METHOD OF MAKING THE SAME

[75] Inventor: Aubin U. Wilkens, Nijmegen, Netherlands

[73] Assignee: U.S. Philips Corporation, New York, N.Y.

[21] Appl. No.: 284,436

[22] Filed: Jul. 20, 1981

[30] Foreign Application Priority Data

Aug. 18, 1980 [NL] Netherlands ................. 8004651

[51] Int. Cl.³ ................. H01L 29/90; H01L 29/34
[52] U.S. Cl. ................. 357/13; 357/52; 357/89
[58] Field of Search ................. 357/13 Z, 13 U, 13 R, 357/20, 52 RD, 56, 89

[56] References Cited

U.S. PATENT DOCUMENTS

| 3,417,299 | 12/1968 | Dixon et al. | 357/89 X |
| 3,612,959 | 10/1971 | Simon | 357/20 X |
| 4,030,117 | 6/1977 | Kling | 357/13 |

Primary Examiner—Andrew J. James
Assistant Examiner—J. L. Badgett
Attorney, Agent, or Firm—Paul R. Miller

[57] ABSTRACT

The present invention provides an improved Zener diode structure which avoids adverse structure causing leakage current or short circuits, for example. The pn junction is formed on a region of a first conductivity material below a window on the surface of the material. A second conductivity material fills the window to form the pn junction, and forms a sub-region at least at the edges of the window and extending substantially below the pn junction to maintain the pn junction far from the edges of the window.

9 Claims, 8 Drawing Figures

ZENER DIODE AND METHOD OF MAKING THE SAME

The invention relates to a Zener diode comprising a semiconductor body having a first semiconductor region of a first conductivity type adjoining a surface of the body, a protective insulating layer on the surface of the first region having a window which exposes a part of the surface, an epitaxial layer of a second opposite conductivity type situated on the surface through the window and a metal conductor provided on the epitaxial layer. The invention also relates to a method of making the same.

Particularly the invention relates to an improved Zener diode at a high yield rate with a low Zener breakdown voltage, for example, in the order of a few volts at 5 mA measuring current.

Zener diodes are generally used as voltage control diodes, voltage reference elements and threshold voltage devices which have a very accurately determined and reproducible Zener breakdown voltage.

The Zener diode with a low Zener breakdown voltage having an epitaxial layer through a window of a protective insulating layer is disclosed in French specification No. 1.522,532. The advantages of the diode are as follows. The epitaxial layer can easily form an ideal shallow p-n junction for Zener effect having a very steep substantially stepwise impurity concentrate gradient across the junction and a certain thickness of the epitaxial layer can avoid varying or deteriorating the electrical properties of the p-n junction such as a short circuit by deposition of a metal conductor.

When the metal conductor such as silver is directly deposited on a surface of a semiconductor substrate above the shallow p-n junction without the epitaxial layer, the silver penetrates into the semiconductor substrate to destroy the p-n junction during a glass sealing process. The window of the protective insulating layer for selective epitaxial growth enables the manufacture of a large number of the diodes simultaneously on the same semiconductor substrate.

Nevertheless, in manufacturing these known Zener diodes, the average yield rate of the diodes which have reliability, and a very accurately determined and reproducible Zener breakdown voltage is not always sufficient and economical for industrial manufacturing.

It is the object of the invention to provide Zener diodes having improved reliability at a high yield rate.

For this purpose, the Zener-diode of the kind mentioned in the opening paragraph is characterized in that according to the invention, the first semiconductor region comprises a main region at least within the window with an impurity concentration density sufficiently high enough to form a p-n junction for Zener effect, a sub-region of the second conductivity type along the edge of the window which surrounds at least a part of the main region for forming the p-n junction and the depth of the sub-region is larger than that of the p-n junction from the surface of the first region. Moreover, the method of making this device is characterized in that according to the invention it comprises the steps of: providing a first protective insulating layer as a first mask for doping with a first window to form a main region with high impurity concentration, introducing an impurity of the first conductivity type into a zone of the first region through the first window, providing a second mask for selective epitaxial growth, the second mask having a second window which is larger than the first window to expose a part of the surface of the first region including the zone, depositing the epitaxial layer on the exposed surface through the second window and forming simultaneously a p-n junction for Zener effect in the main region and a sub-region of the second conductivity type along the edge of the second window which surrounds the main region.

The invention is based on the recognition that the epitaxial layer along the edge of the window of the protective insulating layer is not always controllably grown and sharply delineated in fine pattern just as the window shape.

In other words, the epitaxial layer may grow a little away from the edge of the window. This might be caused by an occurrence of some local defects or crusts and a difference of wetting or adhesion between the semiconductor body and the protective insulating layer, or the preferential growth of silicon due to the crystal orientation. In fact, some parts of a metal electrode such as deposited silver layer on the epitaxial layer may be directly in contact with the first semiconductor region even if the epitaxial layer slightly overflows on the protective insulating layer.

The direct contact between the metal electrode and the first semiconductor region might affect adversely the function of the p-n function such as a leakage current or a short circuit. In order to avoid undesirable effects at the p-n junction, according to the invention, the subregion is provided along the edge of the window and extends deeper than the level of the Zener p-n junction to remove the edge of the p-n junction sufficiently far from the edge of the window under the protective insulating layer.

The invention will now be described in greater detail with reference to a few embodiments and accompanying drawings in which.

Figure 1:
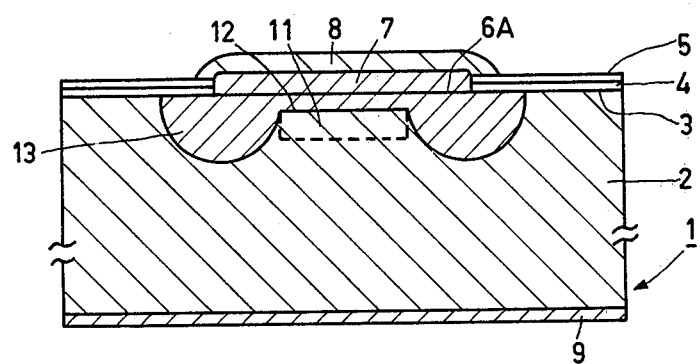
FIG. 1 is a diagrammatic cross-sectional view of a Zener diode according to the invention.
Figure 2:
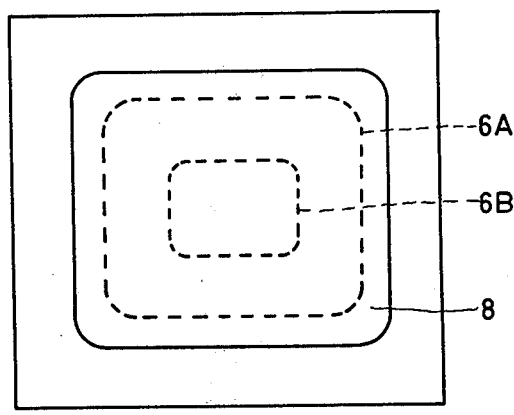
FIG. 2 is a diagrammatic plan view of the diode shown in FIG. 1, FIGS. 3 to 5 are diagrammatic cross-section views of the diode shown in FIG. 1 in successive stages of the manufacture.
Figure 3:
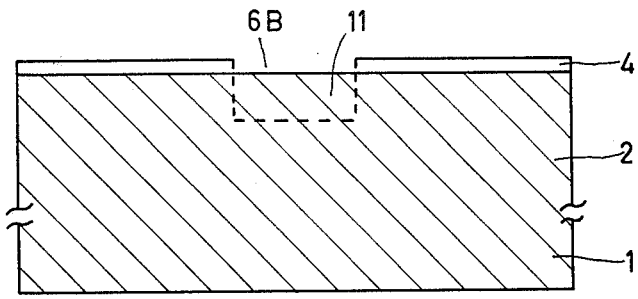
Figure 4:
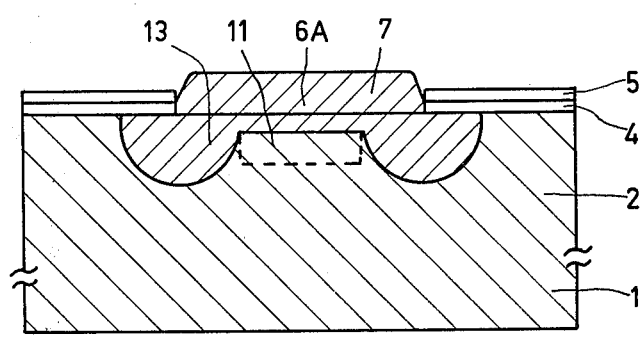
Figure 5:
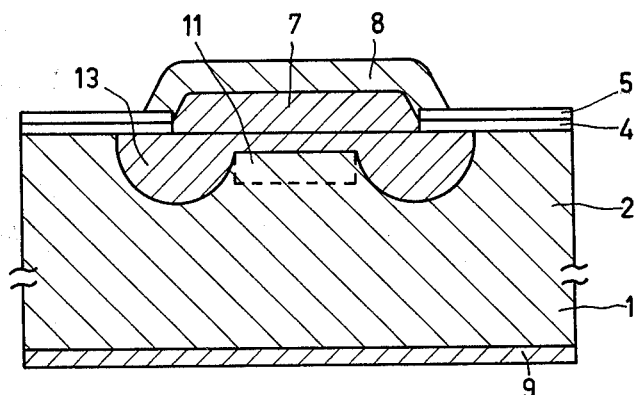

For reasons of clarity the figures are diagrammatic and are not drawn to scale, the dimensions, in particular in the direction of thickness, being strongly exaggerated.

Semiconductor regions of the same conductivity types are shaded in the same direction; and corresponding parts are generally referred to by the same reference numerals in the figures.

FIG. 1 is a diagrammatic cross-sectional view of a Zener diode according to the invention. The diode comprises a semiconductor body 1 having a first semiconductor region 2 of a first conductivity type, in this example is n-type conductivity.

The first region 2 adjoins a surface 3 of the semiconductor body 1, provided with protective insulating layers 4, 5 having a window 6A which exposes a part of the surface. An epitaxial layer 7 of a second opposite conductivity type, in this example p-type conductive is situated on the surface 3 through the window 6A.

A contact electrode 8 is provided on top of the epitaxial layer 7.

According to the invention, the first region 2 furthermore comprises a main region 11 at least within the window 6A with an impurity concentration which in this example is between $5 \times 10^{18}$ and $5 \times 10^{19}$ cm$^{-3}$. This concentration is sufficiently high to form a shallow p-n junction 12 for Zener effect. Along the edge of the window 6A, a sub-region 13 of the second conductivity type is provided, in this example p type conductive material which surrounds the main region 11 within the window 6A. The sub-region 13 extends under the protective insulating layers 4. The depth of the sub-region 13 is larger than that of the p-n junction 12 from the surface 3 of the first region 2. Due to the lateral diffusion of the deep sub-region 13 of the second conductivity type there is practically no risk of varying or deteriorating the electrical properties of the p-n junction such as a short circuit in the case of direct contact between the contact electrode 8 and the surface of the semiconductor region 2. The depth of the sub-region 13 is preferably at least twice as large as that of the p-n junction 12 from the surface 3 of the first region 2. For example, the depth of the p-n junction 12 for Zener effect is approximately 500 Å and the depth of the sub-region 13 is at least about 1000 Å. The impurity concentration gradient on either side of the p-n junction is between $10^{23}$ and $10^{24}$ atoms/cm$^4$.

The diode described can be manufactured in the following way, see FIGS. 2 to 5. Starting material is a semiconductor substrate of an antimony doped n-type silicon having a thickness between 250 and 350 μm and a resistivity of, for example between 8 and $16 \times 10^{-3}$ ohm-cm. In this example, the semiconductor substrate is used as the first semiconductor region 2. The first semiconductor region 2 may also be provided by an epitaxial silicon layer which is grown on the substrate in a thickness of, for example, 25 μm and an n-type impurity concentration of about $1 \times 10^{16}$ cm$^{-3}$.

Only one diode is shown in the figures for clarity, although of course a large number of diodes may be manufactured simultaneously on one semiconductor substrate 1.

A first protective insulating layer 4 of silicon oxide as a first mask for doping having a thickness of approximately 0.5 μm is provided on the surface of the first region 2, for example by thermal oxidation. A first window 6B for forming a main region with high impurity concentration is then delineated by an etching process in in the first protective layer 4, for example, a square window having sides of about 360 μm, see FIGS. 2 and 3.

An n-type doping agent such as phosphorus is introduced selectively into a zone of the first region 2 through the first window 6B to form the main region. The main region comprises a zone of relatively low resistivity which is provided with a higher impurity concentration of the first conductivity type, for example, between $5 \times 10^{18}$ and $5 \times 10^{19}$ atoms-cm$^{-3}$, than the surrounding region of the first semiconductor region 2.

During the n-type impurity introducing process by conventional thermal diffusion, a very thin oxide layer, approximately 0.05 μm thick layer, which is not shown in the figure may grow on the surface of the first window 6B.

Another protective insulating layer 5 of silicon nitride as a second mask for the selective epitaxial growth is deposited on the surface 3 of the first region 2. A second window 6A having sides of approximately 300 μm which is larger than the first window 6B is then provided to expose a part of the surface 3 of the first region 2 including the zone of the main region 11. The main region 11 is substantially symmetrical within the enlarged second window 6A, see plan view of FIG. 2.

The protective layer need not necessarily be a double layer 4, 5 as described. The protective layer is to be used as a mask for doping and as a mask for the selective epitaxial growth so that a single layer can be used.

However, the double layer used in this example is preferred because the silicon nitride protects the silicon oxide against chlorine during the epitaxial growth.

While using the protective insulating layer as a mask, an epitaxial silicon layer 7 with high impurity concentration of p-type doping agent such as boron is selectively deposited on the exposed surface through the second window 6A. The epitaxial depositing process is succeeded by a known vapour phase epitaxial growth. The source material for silicon epitaxial growth may comprise a compound of silicon, for example trichlorosilane SiHCl$_3$ and this source material is fed in its gaseous state into an epitaxial growth reactor with a carrier gas such as hydrogen gas H$_2$ or argon gas Ar, an etchant gas such as hydrochloride HCl for etching the exposed surface 3 and a doping material, for example, diborane B$_2$H$_6$ giving a predetermined impurity concentration for example $2 \times 10^{20}$ cm$^{-3}$. Since the epitaxial growth reactor is heated to a temperature above the decomposition temperature of approximately 1050° C. for between 2 and 10 minutes, the silicon epitaxial layer 7 is deposited on the exposed surface in a thickness of about 3 μm. During the epitaxial growth the p-n junction for Zener effect in the main region is formed. Simultaneously a sub-region of the second conductivity type which surrounds the main region within the second window 6A is formed which extends deeper into the first region 2 because of the lower doping concentration of the first region 2. Finally the thickness of the semiconductor body is reduced to approximately 100–150 μm by grinding and etching. Then the metal conductor 8 is formed on the epitaxial layer 7 and the other contact electrode 9 may be provided on the back side of the body 1.

The semiconductor body is then divided into separate diodes by scratching and breaking or in a different manner, which diodes may be encapsulated in a usual manner.

The invention is not restricted by the embodiment described.

For example, when an epitaxial silicon layer is used as the first semiconductor region, the main region may extend down to the semiconductor substrate with higher impurity concentration, if desired.

Figure 6:
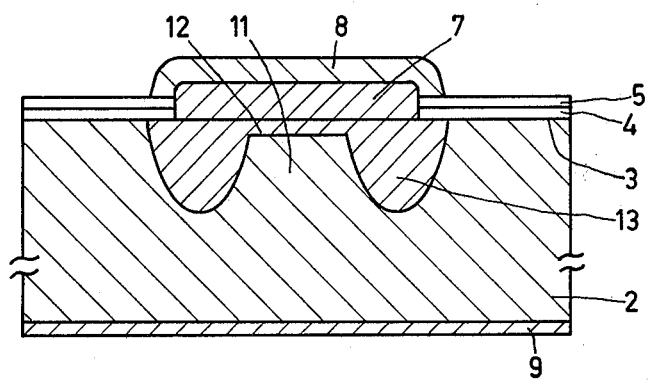
FIG. 6 is a diagrammatic cross-sectional view of another embodiment of the diode in accordance with the invention.

FIG. 6 shows another embodiment using a semiconductor substrate as a first semiconductor region 2 with high impurity concentration without an epitaxial layer as a starting material. The main region 11 with an impurity concentration density sufficient enough to form the p-n junction for Zener effect is formed by the highly doped substrate without selective diffusion for the main region.

Figure 7:
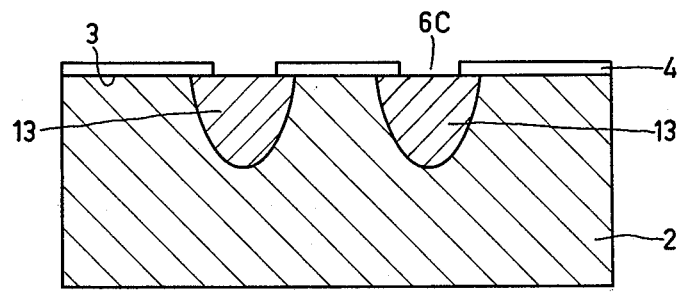
FIGS. 7 and 8 are diagrammatic cross-sectional views of the diode shown in FIG. 6 in successive stages of the manufacture.
Figure 8:
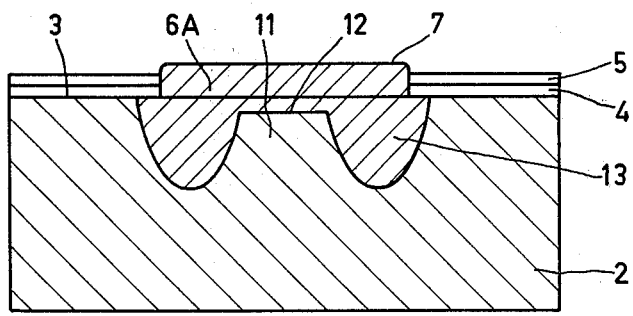

FIGS. 7 and 8 show the manufacturing of the diode shown in FIG. 6 in successive steps of manufacture. Starting material is a semiconductor substrate 2 of n-type conductive silicon having a thickness of 350 μm and an impurity concentration of $2-5\times10^{19}$ cm$^{-3}$ used as a first semiconductor region 2. On the first region 2, a protective insulating layer 4 used as a mask for doping, for example silicon oxide, is provided by thermal oxidation in a thickness of 0.5 μm. A window 6C is delineated in the shape of an annulus (ring-shape). The inner region of this annulus is to be a main region. A sub-region 13 of a p-type conductive material is obtained by introduction of a p-type doping agent, for example, boron into a zone of the first region through the window 6C in a known manner, for example ion implantation or thermal diffusion. The depth of the sub-region B is about 1000 μm, see FIG. 7, A mask with window 6A which exposes the surface of the inner region of the annulus is provided as a mask for selective epitaxial growth. An epitaxial silicon layer 7 with high impurity concentration of p-type doping agent such as boron, for example $2\times10^{20}$ cm$^{-3}$, is selectively deposited on the exposed surface in the same vapour epitaxial growth method as described in a thickness of $2\sim3$ μm. During the epitaxial growth, a very shallow p-n junction, for example, about 500 Å depth from the surface of the first region, the p-n junction for Zener effect having a very steep impurity concentration gradient of $10^{23}$-$10^{24}$ atoms/cm$^4$ is formed in the main region at least within the window 6A. The p-n junction is surrounded by the sub-region and the depth of the sub-region is at least twice as large as that of the p-n junction from the surface 3.

Providing contact electrodes 8 and 9 and dividing into separate diodes are carried out in the same way as described in the former embodiment.

What is claimed is:

1. A Zener diode comprising a semiconductor body providing a first semiconductor region of a first conductivity type adjoining a surface of said body,
    a protective insulating layer on said surface having a window for exposing a portion of said surface,
    wherein said first semiconductor region includes a main region below and spaced apart from said surface and being within said window, said main region having an impurity concentration density of the first type,
    an epitaxial layer of a second conductivity type provided on and above said surface;
    a second region of said second conductivity type extending from said epitaxial layer to said main region and forming a pn junction therebetween,
    a sub-region of said second conductivity type surrounding said main region and said second region and extending at least below edges of said window, said sub-region extending substantially further below said surface than said pn junction, and said sub-region maintaining said pn junction for Zener effect far from said edges, and
    a metal conductor provided over said epitaxial layer.

2. A Zener diode according to claim 1, wherein said sub-region extends below said surface to a depth at least twice the depth of said pn junction below said surface.

3. A Zener diode according to claim 2, wherein said depth of said pn junction for Zener effect is approximately 500 Angstroms, and said depth of said sub-region is at least 1000 Angstroms.

4. A Zener diode according to claim 3, wherein the impurity concentration gradient on either side of said pn junction for Zener effect is between $10^{23}$ and $10^{24}$ atoms/cm$^4$.

5. A Zener diode according to claim 1, wherein said sub-region extends below said surface to a depth of at least 1,000 Angstroms, and said pn junction for Zener effect extends below said surface to a depth of approximately 500 Angstroms.

6. A Zener diode according to claim 5, wherein the impurity concentration gradient on either side of said pn junction for Zener effect is between $10^{23}$ and $10^{24}$ atoms/cm$^4$.

7. A Zener diode according to claim 2, wherein the impurity concentration gradient on either side of said pn junction for Zener effect is between $10^{23}$ and $10^{24}$ atoms/cm$^4$.

8. A Zener diode according to claim 1, wherein the impurity concentration gradient on either side of said pn junction for Zener effect is between $10^{23}$ and $10^{24}$ atoms/cm$^4$.

9. A Zener diode according to claim 1, wherein said main region includes a zone of relatively low resistivity, said zone having a higher impurity concentration of said first conductivity type than surrounding portions of said first semiconductor region.

* * * * *